US010177342B2

(12) United States Patent
Lee et al.

(10) Patent No.: US 10,177,342 B2
(45) Date of Patent: Jan. 8, 2019

(54) DISPLAY DEVICE

(71) Applicant: Samsung Display Co., Ltd., Yongin-si (KR)

(72) Inventors: Sun Hee Lee, Hwaseong-si (KR); Pil Suk Lee, Seoul (KR); Ju Chan Park, Seoul (KR); Young Gug Seol, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 15/618,869

(22) Filed: Jun. 9, 2017

(65) Prior Publication Data

US 2018/0053913 A1    Feb. 22, 2018

(30) Foreign Application Priority Data

Aug. 22, 2016    (KR) .......................... 10-2016-0106276

(51) Int. Cl.
*H01L 51/52*  (2006.01)
*H01L 27/32*  (2006.01)
*H01L 51/00*  (2006.01)

(52) U.S. Cl.
CPC ...... *H01L 51/5253* (2013.01); *H01L 27/3244* (2013.01); *H01L 27/3258* (2013.01); *H01L 51/0097* (2013.01); *H01L 27/3262* (2013.01); *H01L 2251/5338* (2013.01); *H01L 2251/5369* (2013.01)

(58) Field of Classification Search
CPC ............. H01L 51/5253; H01L 51/0097; H01L 27/3244; H01L 2251/5338; H01L 2251/5369; H01L 27/3258; H01L 27/3262
See application file for complete search history.

(56) References Cited

U.S. PATENT DOCUMENTS

| 7,989,810 | B2 | 8/2011 | Miyasaka et al. |
| 8,289,457 | B2 | 10/2012 | Hwang et al. |
| 2003/0118738 | A1* | 6/2003 | Shuy ............... C04B 41/009 427/402 |
| 2008/0032139 | A1 | 2/2008 | Le Blevennec et al. |
| 2013/0062659 | A1 | 3/2013 | Lee et al. |
| 2014/0077340 | A1 | 3/2014 | Wang et al. |

(Continued)

FOREIGN PATENT DOCUMENTS

| FR | 2 870 989 | 12/2005 |
| JP | 2007-288078 | 1/2007 |

(Continued)

OTHER PUBLICATIONS

Extended European Search Report dated Feb. 19, 2018, in European Patent Application No. 17186034.9.

*Primary Examiner* — Tom Thomas
*Assistant Examiner* — Benjamin Tzu-Hung Liu
(74) *Attorney, Agent, or Firm* — H.C. Park & Associates, PLC (57) ABSTRACT

A display device includes a substrate, a barrier layer, a transistor, and a first impact buffer layer. The barrier layer is disposed on the substrate. The transistor is disposed on the barrier layer. The first impact buffer layer is disposed between the barrier layer and the transistor. The first impact buffer layer includes a nanostructure. The nanostructure includes pores.

20 Claims, 4 Drawing Sheets

(56) References Cited

U.S. PATENT DOCUMENTS

| | | | |
|---|---|---|---|
| 2014/0097430 A1* | 4/2014 | Park | H01L 27/1218 257/48 |
| 2015/0041769 A1 | 2/2015 | Kim et al. | |
| 2015/0188079 A1 | 7/2015 | Kang et al. | |
| 2015/0243705 A1 | 8/2015 | Kim | |

FOREIGN PATENT DOCUMENTS

| | | | |
|---|---|---|---|
| JP | 2007-288078 | * | 11/2007 |
| KR | 10-2009-0103766 | | 10/2009 |
| KR | 10-2012-0014497 | | 2/2012 |
| KR | 10-1529885 | | 3/2015 |

* cited by examiner

DISPLAY DEVICE

CROSS-REFERENCE TO RELATED APPLICATION

This application claims priority from and the benefit of Korean Patent Application No. 10-2016-0106276, filed on Aug. 22, 2016, which is hereby incorporated by reference for all purposes as if fully set forth herein.

BACKGROUND

Field

Exemplary embodiments relate to a display device.

Discussion

A display device, such as an organic light emitting diode display device, a liquid crystal display device, and the like, may be manufactured by forming several layers and elements on a substrate. Glass may be used as the substrate of the display device. A Glass substrate may be relatively heavy and fragile. In addition, a glass substrate may be relatively rigid, and, as such, may not be easily deformed. Dissimilarly, a flexible display device including a flexible substrate has been developed. The flexible substrate may have a relatively low weight, may be relatively strong against impacts, and may be relatively easily deformable. Depending on a usage or a shape of the flexible display device, the flexible display may be classified as, for example, a bendable display device, a foldable display device, a rollable display device, a stretchable display device, and the like. Flexibility of the display device may improve as the thickness of the display device reduces; however, thinner display devices may be more easily damaged from external impact.

The above information disclosed in this Background section is only for enhancement of understanding of the background of the inventive concepts, and, therefore, it may contain information that does not form the prior art that is already known to a person of ordinary skill in the art.

SUMMARY

One or more exemplary embodiments provide a display device that is relatively strong against external impact and has relatively excellent flexibility.

Additional aspects will be set forth in the detailed description which follows, and, in part, will be apparent from the disclosure, or may be learned by practice of the inventive concepts.

According to one or more exemplary embodiments, a display device includes a substrate, a barrier layer, a transistor, and a first impact buffer layer. The barrier layer is disposed on the substrate. The transistor is disposed on the barrier layer. The first impact buffer layer is disposed between the barrier layer and the transistor. The first impact buffer layer includes a nanostructure. The nanostructure includes pores.

According to one or more exemplary embodiments, a display device includes a substrate, a barrier layer, a patterned structure, and an impact buffer layer. The barrier layer is disposed on the substrate. The patterned structure is disposed on the barrier layer. The patterned structure includes a semiconductor layer. The impact buffer layer is disposed between the barrier layer and the patterned structure. The patterned structure is disposed on a first portion of the impact buffer layer and exposes a second portion of the impact buffer layer. The impact buffer layer includes a nanostructure. The nanostructure includes pores.

According to the exemplary embodiments, stress applied to the substrate can be minimized (or at least reduced) so that a display panel including the substrate can be prevented (or at least reduced) from being damaged even through iterative bending or external impact is applied to the substrate. In this manner, exemplary embodiments enhance strength and reliability of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

As customary in the field, exemplary embodiments may be described and illustrated in the drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of exemplary embodiments may be physically separated into two or more interacting and discrete blocks, units, and/or modules without departing from the spirit and scope of the inventive concepts. Further, the blocks, units, and/or modules of exemplary embodiments may be physically combined into more complex blocks, units, and/or modules without departing from the spirit and scope of the inventive concepts.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
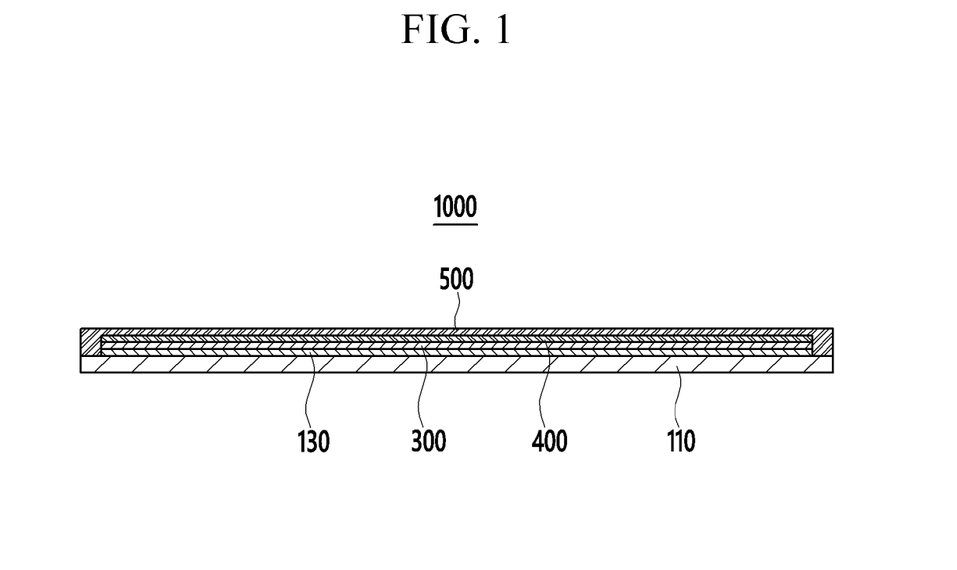
FIG. 1 is a cross-sectional view of a display device, according to one or more exemplary embodiments.
Figure 2:
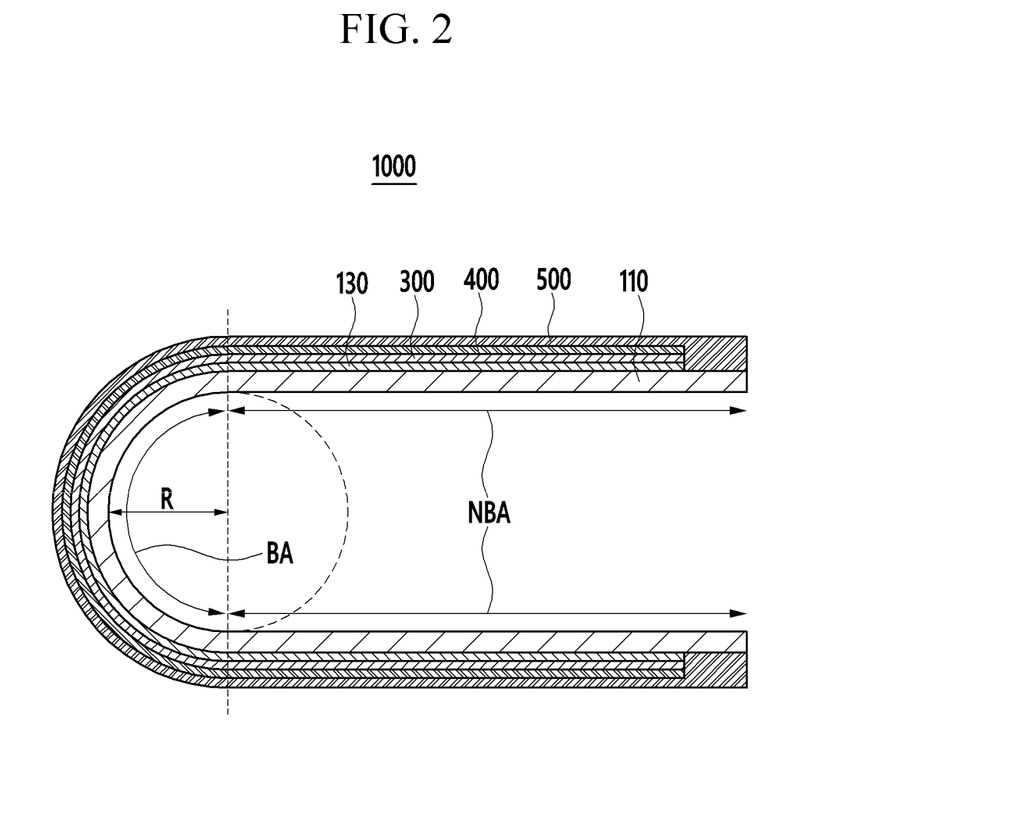
FIG. 2 is a cross-sectional view of the display device of FIG. 1 in a bent state, according to one or more exemplary embodiments.

FIG. 1 is a cross-sectional view of a display device, according to one or more exemplary embodiments. FIG. 2 is a cross-sectional view of the display device of FIG. 1 in a bent state, according to one or more exemplary embodiments.

Referring to FIG. 1, a display device 1000 includes a substrate 110, a first impact buffer layer 130, a driver portion 300, a display portion 400, and a sealing portion 500.

The substrate 110 may be a flexible substrate; however, exemplary embodiments are not limited thereto or thereby. The substrate 110 may be stretchable, foldable, bendable, rollable, or otherwise deformable, and, as such, the entire (or a portion of) the display device 1000 may be flexible, stretchable, foldable, bendable, rollable, or otherwise deformable.

Referring to FIG. 2, the substrate 110 may include a bending area BA in which the substrate 110 is bent and a non-bending area NBA neighboring (e.g., disposed outside) the bending area BA. The bending area BA may be disposed in a central (e.g., center) portion of the substrate 110, and the non-bending area NBA may be disposed at neighboring (e.g., outer) portions of the substrate 110. It is contemplated, however, that the respective locations of the bending area BA and non-bending area NBA may not be limited to the illustrated locations, and, as such, may be variously modified. For example, the bending area BA may be disposed at an outer portion of the substrate 110. As another example, the bending area BA may be disposed throughout the substrate 110. As seen in FIG. 2, however, the bending area BA neighbors the non-bending area NBA.

With continued reference to FIG. 2, the bending area BA of the substrate 110 may be bent such that a curved portion is formed in a first (e.g., left) side, but the bending area BA may be bent such that the curved portion is formed in a second (e.g., right) side, middle portion, etc. A radius of curvature of the bending area BA may be greater than 0 and less than or equal to 2R, such as greater than zero and less than 1R. It is noted that "R" may correspond to the radius of curvature of the bending area BA. That is, the display device 1000 has flexibility so that it can be bent in the bending area BA with the radius of curvature of less than 2R. As will become more apparent below, the display device 1000 has relatively excellent impact resistance, and, thereby, prevents (or at least reduces) the potential for the display device 1000 from being damaged due to external impact, iterative bending, etc.

According to one or more exemplary embodiments, the first impact buffer layer 130, the driver portion 300, the display portion 400, and the sealing portion 500 disposed in the bending area BA may be respectively bent corresponding to the bending of the substrate 110. To this end, the substrate 110 may be bent along any given direction. A given direction may be any direction on a surface of the substrate 110. For example, the substrate 110 may have a rectangular shape in a plane and the given direction may be a direction parallel to a long side or a short side of the substrate 110. That is, the substrate 110 may be bent along a short side direction or a long side direction in a plane. It is also contemplated that the given direction may cross, e.g., diagonally cross, at least one of the short side direction and the long side direction.

Figure 3:
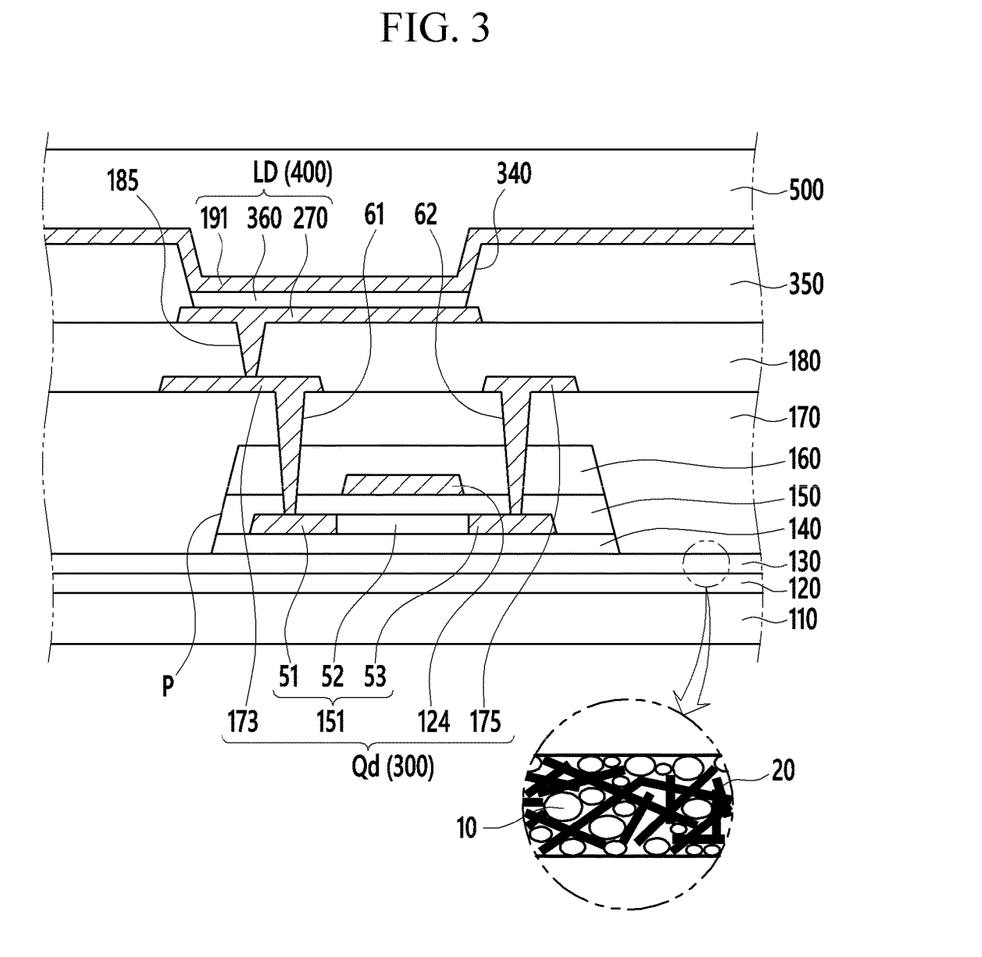
FIG. 3 is a cross-sectional view of a portion of the display device of FIG. 1, according to one or more exemplary embodiments.

FIG. 3 is a cross-sectional view of a portion of the display device of FIG. 1, according to one or more exemplary embodiments. For descriptive convenience, FIG. 3 illustrates a cross-sectional structure of the display device 1000 including a driving transistor, however, the display device 1000 may include a switching transistor, a signal line, and the like, in the cross-sectional structure.

Referring to FIG. 3, the driver portion 300, which is disposed between the first impact buffer layer 130 and the display portion 400, may include a transistor Qd, a buffer layer 140, first to third insulation layers 150, 160, and 170, a planarization layer 180, and a pixel defining layer 350. The display portion 400 may include a display element LD. The sealing portion 500 may cover the display element LD. For instance, the sealing portion 500 may hermetically seal the display element LD to prevent (or at least reduce) permeation of contaminants to the display element LD.

The substrate 110 may be made of at least one of a polymer material, such as polyimide and the like, a metal material, and an inorganic material; however, exemplary embodiments are not limited thereto or thereby. For instance, the substrate 110 may be made of any suitable material having sufficient flexibility. Further, the substrate 110 may be provided in the form of a film, e.g., thin film.

A barrier layer 120 may be disposed between the substrate 110 and the first impact buffer layer 130. The barrier layer 120 is provided to prevent (or at least reduce) moisture and oxygen from permeating into the driver portion 300 or the display portion 400 through the substrate 110. The barrier layer 120 may be made of, for example, an inorganic material, such as silicon oxide, silicon nitride, and the like, or an organic material, such as polyimide, and the like. The barrier layer 120 may have a single layer structure or a multi-layered structure in which at least one layer made of an inorganic material and at least one layer made of an organic material are alternately stacked.

According to one or more exemplary embodiments, the first impact buffer layer 130 may have a nanostructure 20 having pores 10. The nanostructure 20 may include a particle having the form of a node or a branching node, and the length of the longest node may be several hundreds of nanometers. The first impact buffer layer 130 may include a plurality of pores 10 that are naturally formed due to the above-formed nanostructure 20. In this manner, the first impact buffer layer 130 may have porosity in a given range. As such, the first impact buffer layer 130 having the nanostructure 20 may prevent (or at least reduce) layers made of an inorganic material and/or organic material from being cracked. The first impact buffer layer 130 may also prevent (or at least reduce) the driver portion 300 from being damaged from an external impact even though iterative bending and/or impact is applied to the display device 1000.

In one or more exemplary embodiments, the porosity of the first impact buffer layer 130 may be 2% to 45%, such as 5% to 40%, e.g., 10% to 40%. When the porosity of the first impact buffer layer 130 is in the aforementioned range, the display device 1000 can assure relatively excellent impact resistance while having sufficient flexibility. In this manner, the display device 1000 can be prevented (or reduced) from being damaged from iterative bending.

The first impact buffer layer 130 including the nanostructure 20 having the pores 10 may be made of, for example, a carbon-based material or an oxide-based material. The carbon-based material may be, for example, at least one of carbon nanotubes, graphite, and graphene. The oxide-based material may be, for example, at least one of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO). Exemplary embodiments, however, are not limited thereto or thereby.

A patterned structure is disposed on the first impact buffer layer 130. The patterned structure may include the buffer layer 140, a semiconductor layer 151, a gate electrode 124, the first insulation layer 150, and the second insulation layer 160. On the surface of the first impact buffer layer 130, the patterned structure may be patterned to have a pattern P that covers a first portion of the first impact buffer layer 130 and exposes a second portion of the first impact buffer layer 130.

The buffer layer 140 is disposed on the first impact buffer layer 130. The buffer layer 140 provides a flat (or substantially flat) surface for forming the semiconductor layer 151, and prevents (or reduces) the patterned structure from permeation of an impurity during one or more manufacturing processes. The buffer layer 140 may also supply hydrogen and the like to make a characteristic of an element relatively excellent. The buffer layer 140 may be patterned to partially cover the first impact buffer layer 130 that overlaps the semiconductor layer 151.

The semiconductor layer 151 is disposed on the buffer layer 140. The semiconductor layer 151 may include a channel area 52 in which an impurity is not doped, and a source area 53 and a drain area 51 that are disposed at opposite sides of the channel area 52 and are doped with an impurity. It is noted that a doped ion impurity may vary depending on a type of the transistor.

The first insulation layer 150 covers the buffer layer 140 and the semiconductor layer 151, and a gate wire that includes the gate electrode 124 is disposed on the first insulation layer 150. The gate electrode 124 overlaps a portion of the semiconductor layer 151, such as the channel area 52. The first insulation layer 150 may be, for example, made of an inorganic material that includes a nitride or an oxide. The second insulation layer 160 covers the first insulation layer 150 and the gate electrode 124. The second insulation layer 160 may be, for example, made of an inorganic material that includes a nitride or an oxide.

The buffer layer 140, the first insulation layer 150, and the second insulation layer 160 may be patterned to have a pattern P that exposes a portion of the first impact buffer layer 130. For instance, in a manufacturing process, portions of the buffer layer 140, the first insulation layer 150, and the second insulation layer 160 not overlapping the semiconductor layer 151 and the gate electrode 124 may be removed using an etching process and the like such that the portion of the first impact buffer layer 130 can be exposed. Since the buffer layer 140, the first insulation layer 150, and the second insulation layer 160 include the pattern P that exposes the portion of the first impact buffer layer 130, stress applied to the display device 1000 when iteratively bent may be dispersed so that stress concentration can be significantly reduced. In this manner, display device 1000 may have flexibility and impact resistance.

The third insulation layer 170 covers the patterned structure and the first impact buffer layer 130. The third insulation layer 170 may contact the portion of the first impact buffer layer 130 in a region where the buffer layer 140, the first insulation layer 150, and the second insulation layer 160 are exposed. The third insulation layer 170 may be made of, for example, an organic material that includes phenylene, siloxane, or polyimide.

Data wires that include a source electrode 175 and a drain electrode 173 are disposed on the third insulation layer 170. The first insulation layer 150, the second insulation layer 160, and the third insulation layer 170 have a first contact hole 61 and a second contact hole 62 that overlap the source area 53 and the drain area 51 of the semiconductor layer 151. In this manner, the source electrode 175 and the drain electrode 173 are electrically connected to the source area 53 and the drain area 51 of the semiconductor layer 151 via the first contact hole 61 and the second contact hole 62. The semiconductor layer 151, the gate electrode 124, the source electrode 175 and the drain electrode 173 form the transistor Qd. It is contemplated that the configuration of the transistor Qd is not limited thereto or thereby. In this manner, various configurations of transistors may be utilized in association with exemplary embodiments.

The planarization layer 180 is disposed on the third insulation layer 170 and the data wires. The planarization layer 180 serves to remove a step difference to increase light emission efficiency of the display element LD. The planarization layer 180 may have a third contact hole 185 that overlaps the drain electrode 173. Exemplary embodiments are not limited to the aforementioned structure. For instance, one of the planarization layer 180 and the third insulation layer 170 may be omitted.

The display portion 400 includes a first electrode 270, a light emission layer 360, and a second electrode 191. The first electrode 270 is disposed on the planarization layer 180 in an opening 340 in the pixel defining layer 350. The first electrode 270 may be a pixel electrode. The first electrode 270 is connected with the drain electrode 173 via the third contact hole 185 of the planarization layer 180. The second electrode 191 may be a common electrode, which may be common to more than one first electrode 270.

The pixel defining layer 350 is disposed on the planarization layer 180. The pixel defining layer 350 may also be disposed on portions of the first electrode 270. As such, the pixel defining layer 350 includes an opening 340 that overlaps the first electrode 270. The light emission layer 360 may be disposed in the opening 340 of the pixel defining layer 350. For instance, a pixel area where each light emission layer 360 is disposed may be defined by the pixel defining layer 350. In this manner, the pixel defining layer 350 may include a pattern of openings 340, such as a matrix pattern of openings. Exemplary embodiments, however, are not limited thereto or thereby.

The light emission layer 360 is disposed on the first electrode 270. Although not illustrated, the light emission layer 360 may include at least one of an emission layer, a hole injection layer (HIL), a hole transport layer (HTL), an electron transport layer (ETL), and an electron injection layer (EIL), but exemplary embodiments are not limited thereto or thereby. In addition, the second electrode 191 is disposed on the light emission layer 360. As previously mentioned, the second electrode 191 may be a common electrode. The first electrode 270, the light emission layer 360, and the second electrode 191 form the display element LD.

The first electrode 270 and the second electrode 191 may be respectively made of at least one of a transparent conductive material, a transflective, and a reflective conductive material. Depending on a material that forms the first electrode 270 and the second electrode 191, the display device may be considered a top emission type, a bottom emission type, or a double-sided emission type.

The sealing portion 500 is disposed on the second electrode 191. The sealing portion 500 seals the display element LD and a circuit portion (not shown) provided on the substrate 110 for protection from an external environment. The sealing portion 500 may include, for example, an organic layer and an inorganic layer that are alternately stacked, however, exemplary embodiments are not limited thereto or thereby. A structure of the sealing portion 500 can be various modified.

Figure 4:
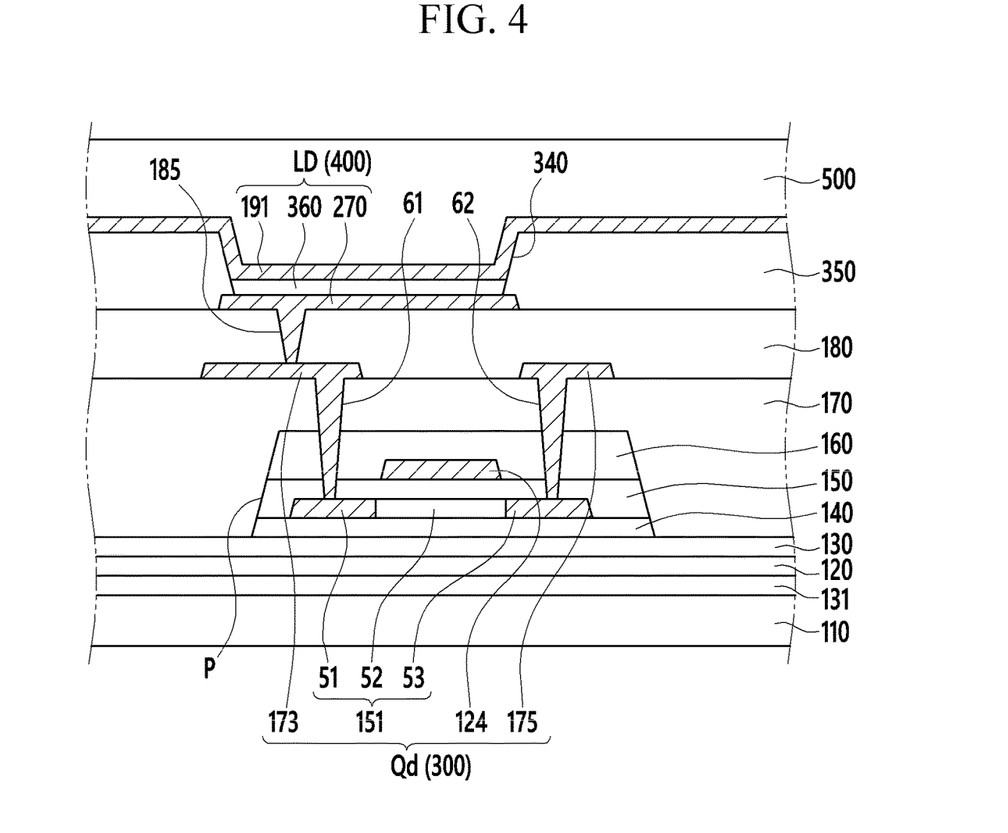
FIG. 4 is a cross-sectional view of a portion of the display device of FIG. 1, according to one or more exemplary embodiments.

FIG. 4 is a cross-sectional view of a portion of the display device of FIG. 1, according to one or more exemplary embodiments. The display device of FIG. 4 may be similar to the display device of FIG. 3, and, as such, duplicative descriptions have been omitted to avoid obscuring exemplary embodiments.

Referring to FIG. 4, a display device may further include a second impact buffer layer 131 that is disposed between the substrate 110 and the barrier layer 120. Except for the second impact buffer layer 131, the display device is the same as the above-described display device of FIG. 3. The second impact buffer layer 131 may include the same material as the first impact buffer layer 130. In one or more exemplary embodiments, since the second impact buffer layer 131 is disposed below the barrier layer 120, the second impact buffer layer 131 may further include an organic material that can fill pores 10 of a nanostructure 20 in order to improve durability of the display device. The organic material may include, for example, polyimide, a polyurethane elastomer, siloxane, or a siloxane hybrid.

Although certain exemplary embodiments and implementations have been described herein, other embodiments and modifications will be apparent from this description. As such, the inventive concepts are not limited to such embodiments, but rather to the broader scope of the presented claims and various obvious modifications and equivalent arrangements.

What is claimed is:

1. A display device comprising:
    a barrier layer disposed on a substrate;
    a transistor disposed on the barrier layer, the transistor comprising:
        a semiconductor layer;
        a source electrode electrically connected to the semiconductor layer; and
        a drain electrode electrically connected to the semiconductor layer;

a first impact buffer layer disposed between the barrier layer and the transistor;
a first insulation layer overlapping a first portion of the first impact buffer layer, the semiconductor layer being disposed between the first insulation layer and the substrate; and
a second insulation layer overlapping the first portion of the first impact buffer layer and contacting a second portion of the first impact buffer layer, the first insulating layer being disposed between the second insulation layer and the semiconductor layer,
wherein:
the second insulation layer is, in a direction normal to a surface of the substrate, disposed between the substrate and at least one of the source electrode and the drain electrode;
the first impact buffer layer comprises a nanostructure; and
wherein the nanostructure comprises pores.

2. The display device of claim 1, wherein the first impact buffer layer comprises at least one of a carbon-based material and an oxide-based material.

3. The display device of claim 1, wherein porosity of the first impact buffer layer is 2% to 45%.

4. The display device of claim 1, further comprising:
a buffer layer disposed between the first impact buffer layer and the transistor.

5. The display device of claim 4, wherein:
the semiconductor layer is disposed on the buffer layer; and
the transistor further comprises a gate electrode disposed on the semiconductor layer.

6. The display device of claim 5, wherein:
the buffer layer is patterned to partially cover the first impact buffer layer; and
the semiconductor layer overlaps a portion of the buffer layer.

7. The display device of claim 6, wherein:
the first insulation layer is disposed between the semiconductor layer and the gate electrode; and
the first insulation layer covers the semiconductor layer and the buffer layer.

8. The display device of claim 7, wherein:
the first insulation layer comprises an inorganic material; and
the inorganic material comprises a nitride or an oxide.

9. The display device of claim 7, further comprising:
a third insulation layer disposed between the gate electrode and the source and drain electrodes,
wherein the third insulation layer covers the first insulation layer and the gate electrode.

10. The display device of claim 9, wherein:
the third insulation layer comprises an inorganic material; and
the inorganic material comprises a nitride or an oxide.

11. The display device of claim 9, wherein:
the second insulation layer is disposed between the third insulation layer and each of the source and drain electrodes; and
the second insulation layer covers the third insulation layer and the first impact buffer layer.

12. The display device of claim 11, wherein:
the second insulation layer comprises an organic material; and
the organic material comprises at least one of phenylene, siloxane, and polyimide.

13. The display device of claim 1, further comprising:
a second impact buffer layer disposed between the substrate and the barrier layer.

14. The display device of claim 13, wherein the second impact buffer layer comprises a same material as the first impact buffer layer.

15. The display device of claim 14, wherein the second impact buffer layer further comprises an organic material.

16. The display device of claim 15, wherein the organic material comprises at least one of polyimide, a polyurethane elastomer, siloxane, and a siloxane hybrid.

17. A display device comprising:
a barrier layer disposed on a substrate;
a patterned structure disposed on the barrier layer, the patterned structure comprising:
a semiconductor layer;
a first insulation layer covering the semiconductor layer; and
an electrode electrically connected to the semiconductor layer;
an impact buffer layer disposed between the barrier layer and the patterned structures; and
a second insulation layer covering the patterned structure and contacting a first portion of the impact buffer layer,
wherein:
the patterned structure is disposed on a second portion of the impact buffer layer and exposes the first portion of the impact buffer layer;
the second insulation layer is disposed, in a direction normal to a surface of the substrate, between the electrode and the substrate;
the impact buffer layer comprises a nanostructure; and
the nanostructure comprises pores.

18. The display device of claim 17, wherein the patterned structure further comprises:
a buffer layer disposed between the semiconductor layer and the first portion of the impact buffer layer, the first insulation layer covering the buffer layer;
a gate electrode disposed on the first insulation layer, the gate electrode overlapping the semiconductor layer; and
a third insulation layer covering the gate electrode and the first insulation layer.

19. The display device of claim 18, further comprising:
a source electrode electrically connected to the semiconductor layer via a first contact hole formed in the first, second, and third insulation layers; and
a drain electrode electrically connected to the semiconductor layer via a second contact hole formed in the first, second, and third insulation layers,
wherein:
the electrode is the source electrode or the drain electrode;
the second insulation layer covers the impact buffer layer; and
the second insulation layer is disposed between the substrate and each of the source electrode and the drain electrode.

20. The display device of claim 17, further comprising:
an additional impact buffer layer disposed between the substrate and the barrier layer,
wherein the additional impact buffer layer comprises the same material as the impact buffer layer.

* * * * *